United States Patent
Yan et al.

(10) Patent No.: US 12,161,052 B2
(45) Date of Patent: Dec. 3, 2024

(54) EXPITAXIAL SEMICONDUCTOR/SUPERCONDUCTOR HETEROSTRUCTURES

(71) Applicants: Cornell University, Ithaca, NY (US); The Government of the United States of America, as represented by the Secretary of the Navy, Washington, DC (US)

(72) Inventors: Rusen Yan, Ithaca, NY (US); Guru Bahadur Singh Khalsa, Ithaca, NY (US); John Wright, Ithaca, NY (US); H. Grace Xing, Ithaca, NY (US); Debdeep Jena, Ithaca, NY (US); D. Scott Katzer, Washington, DC (US); Neeraj Nepal, Washington, DC (US); Brian P. Downey, Washington, DC (US); David J. Meyer, Washington, DC (US)

(73) Assignees: Cornell University, Ithaca, NY (US); Govmt. of U.S.—Navy, Washington, DC (US)

( * ) Notice: Subject to any disclaimer, the term of this patent is extended or adjusted under 35 U.S.C. 154(b) by 1026 days.

(21) Appl. No.: 16/978,415

(22) PCT Filed: Mar. 6, 2019

(86) PCT No.: PCT/US2019/020911
§ 371 (c)(1),
(2) Date: Sep. 4, 2020

(87) PCT Pub. No.: WO2019/173448
PCT Pub. Date: Sep. 12, 2019

(65) Prior Publication Data
US 2021/0043824 A1  Feb. 11, 2021

Related U.S. Application Data

(60) Provisional application No. 62/639,302, filed on Mar. 6, 2018.

(51) Int. Cl.
*H10N 60/12* (2023.01)
*H10N 60/01* (2023.01)
(Continued)

(52) U.S. Cl.
CPC .......... *H10N 60/12* (2023.02); *H10N 60/0941* (2023.02); *H10N 60/203* (2023.02); *H10N 69/00* (2023.02)

(58) Field of Classification Search
CPC .. H10N 60/12; H10N 60/0941; H10N 60/203; H10N 69/00
See application file for complete search history.

(56) References Cited

U.S. PATENT DOCUMENTS

| | | |
|---|---|---|
| 4,157,555 A | 6/1979 | Gray |
| 4,220,959 A | 9/1980 | Kroger |

(Continued)

FOREIGN PATENT DOCUMENTS

| | | |
|---|---|---|
| JP | H0783145 B2 | 9/1995 |
| JP | 2009232311 A | 10/2009 |

OTHER PUBLICATIONS

Patsalas et.al., Materials Sci and Eng. vol. 123, Jan. 2018, pp. 1-55 (Year: 2018).*

(Continued)

*Primary Examiner* — Jeffrey T Carley
*Assistant Examiner* — Jose K Abraham
(74) *Attorney, Agent, or Firm* — Orlando Lopez; CM Law

(57) ABSTRACT

Solid-state devices including a layer of a superconductor material epitaxially grown on a crystalline high thermal (Continued)

conductivity substrate, the superconductor material being one of TiNx, ZrNx, HfNx, VNx, NbNx, TaNx, MoNx, WNx, or alloys thereof, and one or more layers of a semiconducting or insulating or metallic material epitaxially grown on the layer of superconductor material, the semiconducting or insulating material being one of a Group III N material or alloys thereof or a Group 4b N material or SiC or ScN or alloys thereof.

15 Claims, 14 Drawing Sheets

(51) Int. Cl.
*H10N 60/20* (2023.01)
*H10N 69/00* (2023.01)

(56) References Cited

U.S. PATENT DOCUMENTS

| | | | |
|---|---|---|---|
| 4,242,419 A * | 12/1980 | Dayem | H10N 60/0184 |
| | | | 252/514 |
| 4,575,741 A | 3/1986 | Frank | |
| 4,768,069 A | 8/1988 | Talvacchio | |
| 5,304,538 A | 4/1994 | Vasquez | |
| 5,323,023 A * | 6/1994 | Fork | H10N 60/0632 |
| | | | 257/295 |
| 5,621,223 A * | 4/1997 | Nakamura | H10N 60/124 |
| | | | 257/38 |
| 5,810,923 A * | 9/1998 | Yano | H01L 21/02197 |
| | | | 257/E21.271 |
| 6,046,464 A | 4/2000 | Schetzina | |
| 11,831,295 B2 * | 11/2023 | Gokhale | H03H 9/174 |
| 2001/0035524 A1 | 11/2001 | Zehe | |
| 2002/0189533 A1 * | 12/2002 | Kim | C30B 1/023 |
| | | | 117/101 |
| 2003/0042481 A1 * | 3/2003 | Tzalenchuk | G06N 10/00 |
| | | | 257/E39.015 |
| 2003/0173498 A1 * | 9/2003 | Blais | B82Y 10/00 |
| | | | 257/E39.015 |
| 2005/0197254 A1 * | 9/2005 | Stasiak | G03F 7/0002 |
| | | | 505/162 |
| 2008/0272302 A1 | 11/2008 | Frey | |
| 2009/0137398 A1 * | 5/2009 | Bozovic | H10N 60/858 |
| | | | 428/457 |
| 2012/0077680 A1 * | 3/2012 | Berggren | G01J 1/42 |
| | | | 427/63 |
| 2013/0143744 A1 * | 6/2013 | Marsili | H10N 60/84 |
| | | | 716/122 |
| 2013/0187051 A1 * | 7/2013 | McCaughan | H10N 60/84 |
| | | | 250/208.2 |
| 2014/0008660 A1 * | 1/2014 | Jorgenson | H01L 31/1856 |
| | | | 257/76 |
| 2014/0087952 A1 * | 3/2014 | Nam | G01J 1/0425 |
| | | | 505/181 |
| 2014/0299751 A1 | 10/2014 | Tang | |
| 2014/0353476 A1 * | 12/2014 | Bachar | H10N 60/85 |
| | | | 250/227.24 |
| 2017/0186933 A1 * | 6/2017 | Sunter | H01L 31/107 |
| 2017/0263794 A1 | 9/2017 | Jorgenson | |
| 2018/0145110 A1 * | 5/2018 | Zhao | H04N 25/75 |
| 2019/0035999 A1 * | 1/2019 | Najafi | H01L 31/00 |
| 2019/0044048 A1 * | 2/2019 | George | H01L 29/66977 |

OTHER PUBLICATIONS

Tsavdaris et al., A Chemical Vapor Deposition Route to Epitaxial Superconducting NbTiN Thin Films, Chem. Mater., Jan. 2017, 29, 14, 5824-5830 (Year: 2017).*
Quantum and Thermal Phase Slips in Superconducting Niobium Nitride (NbN) Ultrathin Crystalline Nanowire: Application to Single Photon Detection, Nano Lett. 2012, 12, 3501-3506; (Year: 2012).*
A Superconducting-Nanowire Three-Terminal Electrothermal Device, Nano Lett. 2014, 14, 10, 5748-5753 (Year: 2014).*
Nakamura et.al., "Superconducting qubits consisting of epitaxially grown NbN/AlN/NbN Josephson junctions" Applied Physics Letters 99, 212502, 2011 (Year: 2011).*
Meyer et al., Epitaxial Lift-Off and Transfer of III-N Materials and Devices from SiC Substrates, IEEE Transactions on Semiconductor Manufacturing, vol. 29, No. 4, Oct. 27, 2016, pp. 384-389.

* cited by examiner

Amplified on-chip

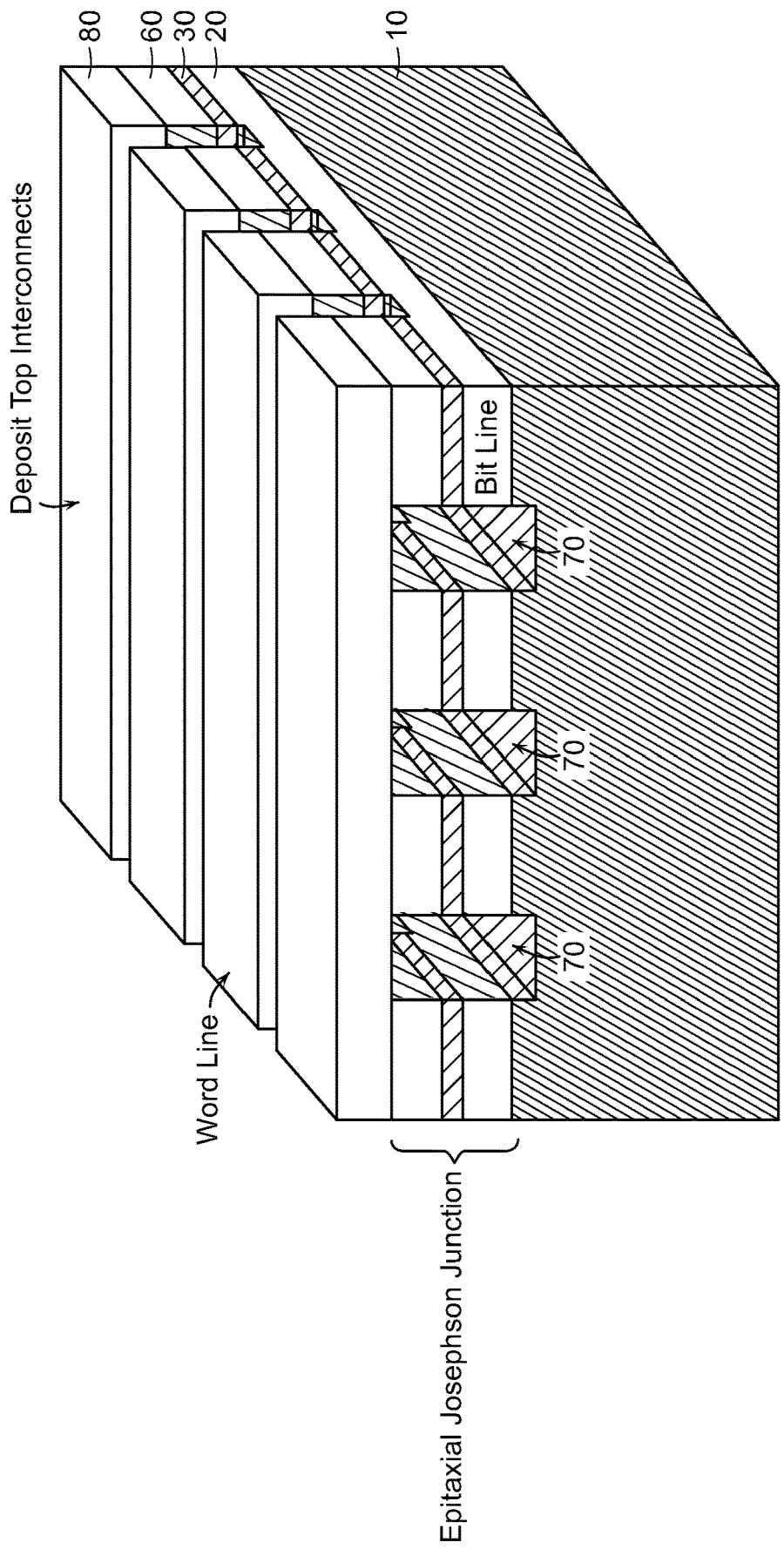

EXPITAXIAL SEMICONDUCTOR/SUPERCONDUCTOR HETEROSTRUCTURES

This application is a U.S. national stage application under 35 U.S.C. 371 of co-pending International Application No. PCT/US19/020991 filed on Mar. 6, 2019 and entitled EPITAXIAL SEMICONDUCTOR/SUPERCONDUCTOR HETEROSTRUCTURES, which in turn claims priority to U.S. Provisional Patent Application No. 62/639,302, filed Mar. 6, 2018, both of which are incorporated herein by reference in their entirety and for all purposes.

BACKGROUND OF THE INVENTION

Field of the Invention

The subject disclosure relates to semiconductor heterostructures on crystalline superconductors, and epitaxial integration of the semiconductors and superconducting nitride families.

BACKGROUND OF THE RELATED ART

The experimental discovery of superconductivity in 1911 predated the controllable synthesis and understanding of semiconductors by nearly three decades. In the time it took to uncover the correlated physics behind superconductivity, rapid advances in the band-theory of semiconductors, perfection in crystal growth, and discoveries such as donor and acceptor doping and quantum heterostructure design unleashed their technological potential, enabling electronic amplifiers and switches, and light-emitting diodes and diode lasers that operate at room temperature. These solid-state devices have replaced bulky and slow vacuum tubes and table-top lasers, and have shrunk information processing, storage, and communication systems on to a chip.

Today, semiconductor transistors are reaching their fundamental Boltzmann limits of switching energy and power consumption in the digital von-Neumann computational architecture, and communication systems are approaching their Shannon limits in bandwidth and security. Systems with exponentially faster computation and guaranteed secure communications have been envisioned with quantum computation and quantum communications. The leading materials for these emerging quantum technologies make use of the macroscopic manifestation of quantum properties in superconductors. Devices such as Josephson junction flux qubits, lossless microwave resonators, ac Josephson junction lasers, and superconducting single-photon detectors are the building blocks of these new quantum information systems.

Significant advances in such systems are expected if the power of semiconductors can be combined with those of superconductors on a single epitaxial platform. The group III-nitride semiconductors GaN (of bandgap $E_g \sim 3.4$ eV), InN ($E_g \sim 0.6$ eV) and AlN ($E_g \sim 6.2$ eV) are the most revolutionary semiconductor family since silicon. That is because they offer in a single heterostructure material family (see FIG. 1), the necessary ingredients for ultrafast microwave communications, ultra-low power computation, high-voltage switches, infrared through visible to deep ultraviolet photonic emitters and detectors, and high-frequency circuit components such as surface acoustic wave (SAWs) and bulk acoustic wave sensor (BAW) filters. On the other hand, one of the most technologically important superconductor family is the nitride compound $NbN_x$, which has been used for superconducting RF circuits, SQUID magnetometers, Josephson junctions, single-photon detectors for quantum communications and astronomy, and a host of other applications.

There is a need for the successful epitaxial integration of semiconductors and superconducting nitride families, which can serve as a crucial enabler for several future applications.

SUMMARY

Devices resulting from the successful epitaxial integration of semiconductors and materials from superconducting nitride families are disclosed hereinbelow.

In one or more embodiments, the device of this disclosure includes a layer of a superconductor material epitaxially grown on a crystalline high thermal conductivity substrate, the superconductor material being one of TiNx, ZrNx, HfNx, VNx, NbNx, TaNx, MoNx, TaNx, or alloys thereof, and one or more layers of a semiconducting or insulating or metallic material epitaxially grown on the layer of superconductor material, the semiconducting or insulating material being one of a Group III-N (nitride) material or alloys thereof or a Group 4b-N (nitride), or transition metal nitride material, or SiC or alloys thereof.

A number of exemplary embodiments of the device are disclosed herein below.

In one exemplary embodiment, the device of this disclosure results in a crossbar array of Josephson junctions.

In one or more embodiments, the method of this disclosure for forming a crossbar array of Josephson junctions includes epitaxially growing a layer of superconductor material on a crystalline high thermal conductivity substrate; the superconductor material being one of TiNx, ZrNx, HfNx, VNx, NbNx, TaNx, MoNx, WNx, or alloys thereof, the crystalline high thermal conductivity substrate is one of GaN, AlN, 4H- and 6H-SiC, AlScN, GaScN, 3C-SiC or Si, epitaxially growing of a layer of a semiconducting or insulating or metallic material on the layer of superconductor material, the semiconducting or insulating material being one of a Group III-N (nitride) material or alloys thereof or a Group 4b-N (nitride), or transition metal nitride material, or SiC or alloys thereof, epitaxially growing another layer of the superconductor material on the layer of the semiconducting or insulating material, etching said another layer of the superconductor material so that a pattern of linear elements extending along one of two orthogonal axes in a plane is formed, and, etching said layer of the superconductor material such that a pattern of linear elements extending along another one of the two orthogonal axes in the plane is formed.

Other embodiments are also disclosed.

It should be appreciated that the subject technology can be implemented and utilized in numerous ways, including without limitation as a process, an apparatus, a system, a device, a method for applications now known and later developed. These and other unique features of the system disclosed herein will become more readily apparent from the following description and the accompanying drawings.

BRIEF DESCRIPTION OF THE DRAWINGS

So that those having ordinary skill in the art to which the disclosed technology appertains will more readily understand how to make and use the same, reference may be had to the following drawings.

FIG. 8b shows a schematic circuit diagram of the embodiment shown in FIG. 8a;

FIG. 9c shows a perspective view of the embodiment in FIG. 9a;

FIGS. 10a-10e shows one embodiment of the method of this disclosure for forming a Josephson junction crossbar array.

DETAILED DESCRIPTION

Figure 1:
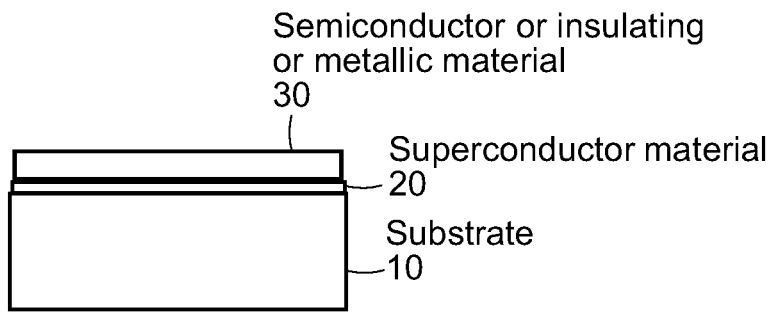
FIG. 1 shows one embodiment of the device of this disclosure.

The subject technology overcomes many of the prior art problems associated with the successful epitaxial integration of semiconducting materials and superconducting nitride families. The advantages, and other features of the technology disclosed herein, will become more readily apparent to those having ordinary skill in the art from the following detailed description of certain preferred embodiments taken in conjunction with the drawings which set forth representative embodiments of the present technology and wherein like reference numerals identify similar structural elements. Directional indications such as upward, downward, right, left, bottom, top and the like are used with respect to the figures and not meant in a limiting manner.

Group III, as used herein, refers to CAS Group IIIA (Triels or the Boron group) in the periodic table.

III-nitride semiconductor materials, as used herein, refers to (B, Al, In, Ga and their alloys) N.

Group 4b, as used herein is a group of elements in the periodic table, which includes the elements titanium (Ti), zirconium (Zr), hafnium (Hf).

Group 4b-nitride semiconductor materials, as used herein, includes ZrN and HfN.

Semiconductor materials, as used herein, includes materials with controlled introduction of impurities ("doping") into the crystal structure.

Metallic materials, as used herein, includes alloys of metals. An exemplary embodiment of an alloy of a metal is TaN.

In summary, the present disclosure teaches epitaxial integration of semiconducting material and superconducting nitride families. FIG. 1 shows a layer of a superconductor material 20 epitaxially grown on a crystalline high thermal conductivity substrate 10. One or more layers of a semiconducting or insulating or metallic material 30 are epitaxially grown on the layer of superconductor material. The superconductor material being one of TiNx, ZrNx, HfNx, VNx, NbNx, TaNx, MoNx, WNx or alloys thereof. The semiconducting material being one of a Group III-N (nitride) material or alloys thereof or a Group 4b-N (nitride), or transition metal nitride material, or SiC or alloys thereof. The crystalline high thermal conductivity substrate is one of GaN, AlN, 4H- and 6H-SiC, AlScN, GaScN, 3C-SiC or Si.

Figure 1A:
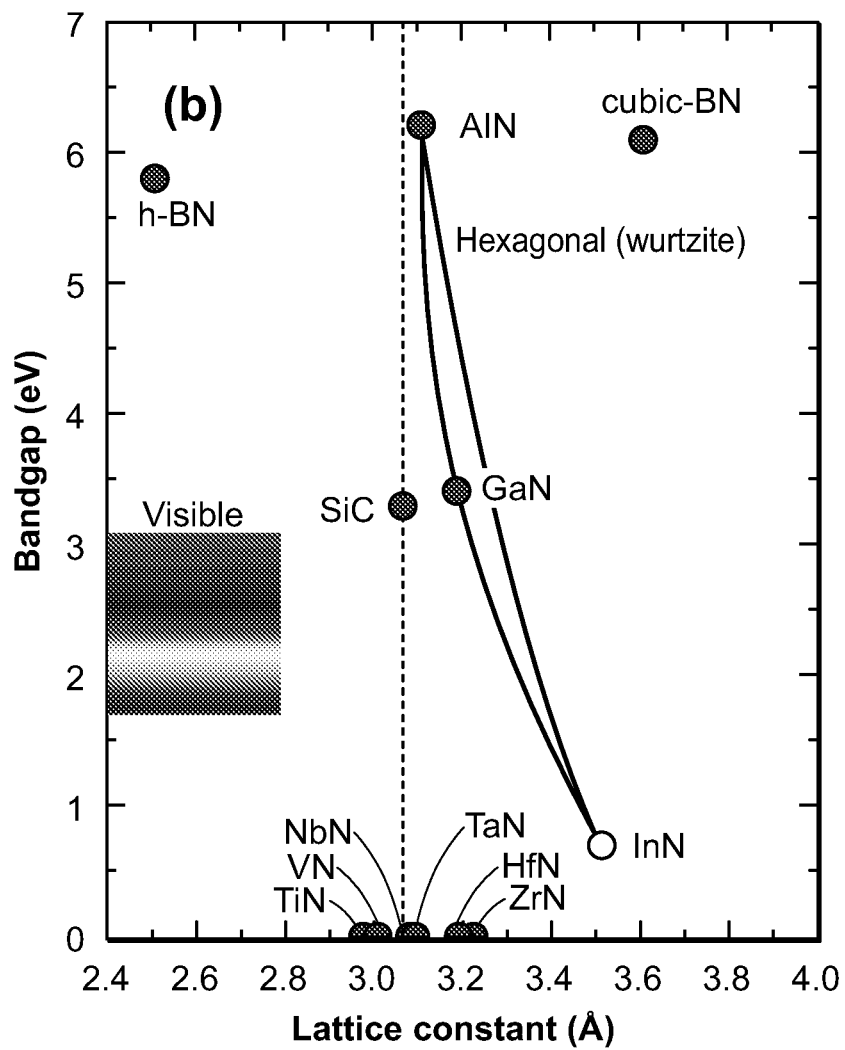
FIG. 1a shows that the lattice constants of nitride metals compared to those of the SiC, AlN, and GaN family.

FIG. 1(a) shows that the lattice constants of nitride metals such as TiN, VN, NbN, TaN, HfN, ZrN are very close to the SiC, AlN, and GaN family (hexagonal Nb2N and cubic NbN rotated onto the (111) plane are also close). Wurtzite GaN and AlN can be grown on cubic (111) silicon, and wurtzite SiC serves as the substrate for the epitaxial growth of AlN and GaN based heterostructures.

In one exemplary embodiment, the epitaxial $NbN_X$ films were grown at 800° C. by radio-frequency (RF) plasma-assisted molecular beam epitaxy (MBE) on 3-inch diameter metal-polar semi-insulating 4H- and 6H-SiC substrates. The substrates were commercially polished using chemical-mechanical polishing to an epi-ready finish and were used as-received. The reactive nitrogen was generated using an RF plasma source fed by ultra-high-purity Nitrogen which was further purified by an in-line purifier. The Nb flux was generated using an in-situ electron beam evaporator source with 3N5-pure (excluding Ta) Nb pellets in a W hearth liner. The epiMetal layers retained high crystallinity and electronic conductivity down to thicknesses of a few nanometres. The crystalline phases of the epilayers could be either hexagonal Nb2N or NbN, or cubic NbN. In one embodiment, by secondary-ion mass spectrometry, the films are cubic NbN$_X$, with X being approximately 0.75-0.88 as measured. In what follows, the phase and stoichiometry is simply referred to as NbN$_X$.

Figure 1B:
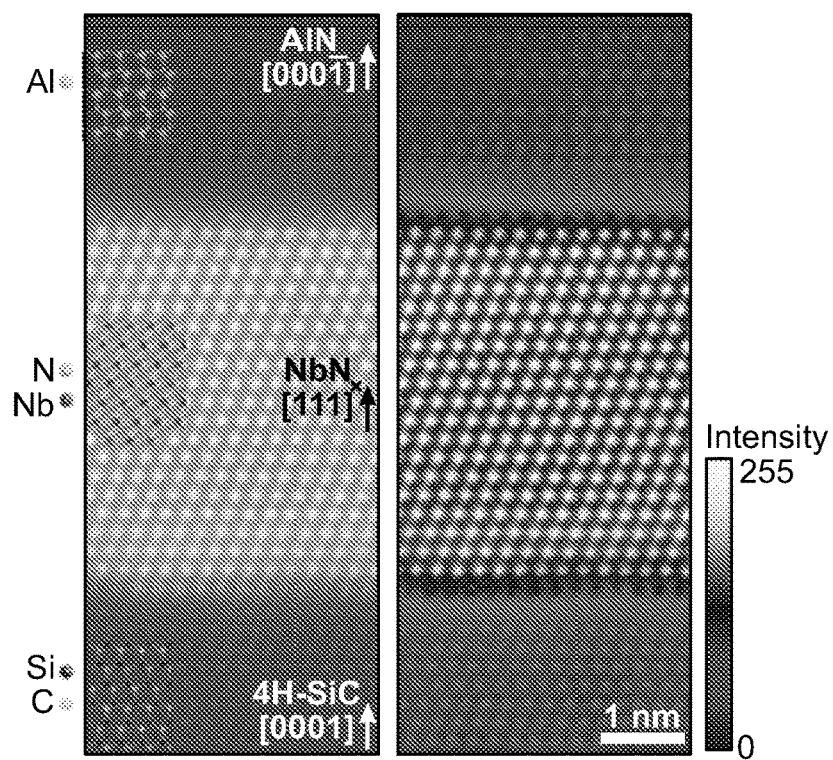
FIG. 1b shows that the cubic growth is along [111] on the hexagonal film.

FIG. 1b shows high-angle annular dark-field scanning transmission electron microscopy (HAADF-STEM) images of 5 nm NbN$_x$ epitaxial layers grown on a semi-insulating 4H-SiC substrate and capped with an AlN layer. The epitaxial NbN$_x$ layers are nearly completely cubic, with high crystalline quality over large areas. Occasional twin boundaries are seen typically separated by about 1 μm as would be expected from the symmetry mismatch between cubic NbN$_x$ and hexagonal SiC and AlN. FIG. 1b shows the epitaxial AlN on the NbN$_x$ to be of nitrogen polarity; the entire AlN layer and all subsequent nitride semiconducting layers are hexagonal. The surfaces of uncapped NbN$_x$ layers were extremely smooth, with a root-mean-square surface roughness of 0.16 nm for a 1 μm×1 μm region, as measured by atomic force microscopy.

Figure 1C:
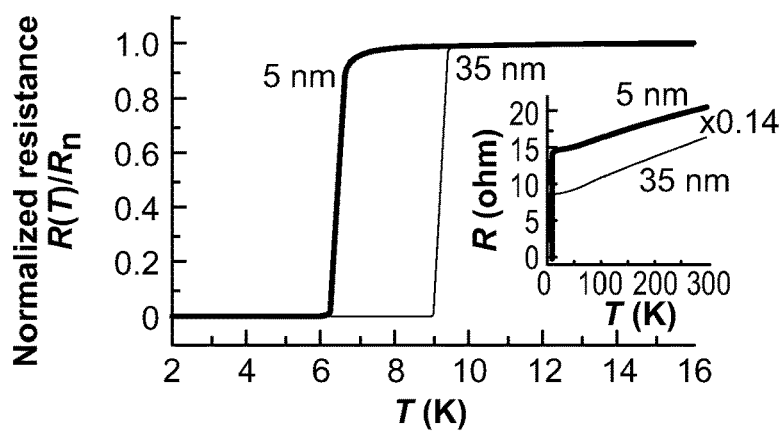
FIG. 1c shows Resistance versus temperature showing the superconducting phase transition of 5 nm and 35 nm epitaxial $NbN_X$ on SiC.
Figure 1D:
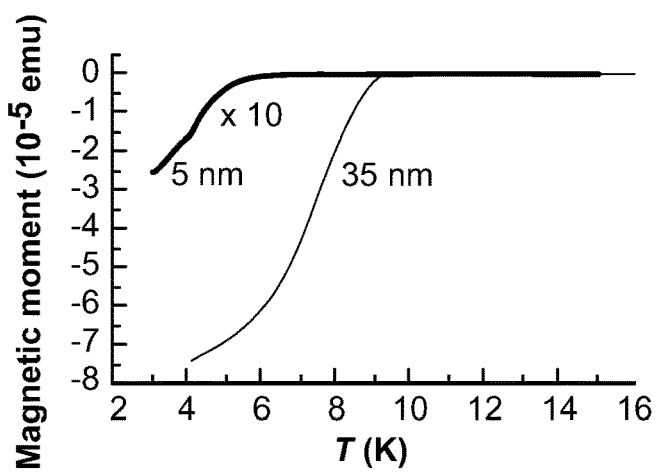
FIG. 1d shows Meissner effect measurement of $T_c$ by VSM of 5 nm and 35 nm epitaxial $NbN_X$ on SiC.

Electrical transport measurements performed on the NbN$_x$ layers, for thicknesses ranging from 4 nm to 100 nm, revealed superconductivity at transition temperatures of between 6 K and 15 K. FIG. 1c shows the measured resistance R(T) normalized to the resistance at 16 K (R$_n$) for NbN$_x$ layers of thickness 5 nm and 35 nm. The resistivity of the samples exhibits a superconducting phase transition at around 7 K for the 5-nm sample, and about 9 K for the 35-nm sample. The inset shows the resistance up to 300 K for these two samples. In the metallic phase for temperatures T$_c$<T<300 K, the resistance shows an expected increase owing to phonon scattering. FIG. 1d shows the Meissner effect measured on these two samples by vibrating sample magnetometry (VSM), revealing clear magnetic-flux expulsion accompanying the superconducting phase transition. The superconductivity transition temperature measured from electron transport and the Meissner effect are found to be consistent. (Further information on Electronic and magnetic properties of MBE-grown NbN$_X$ is provided in U.S. Provisional Patent Application No. 62/639,302, filed Mar. 6, 2018, which is incorporated herein by reference in its entirety and for all purposes.)

Figure 2:
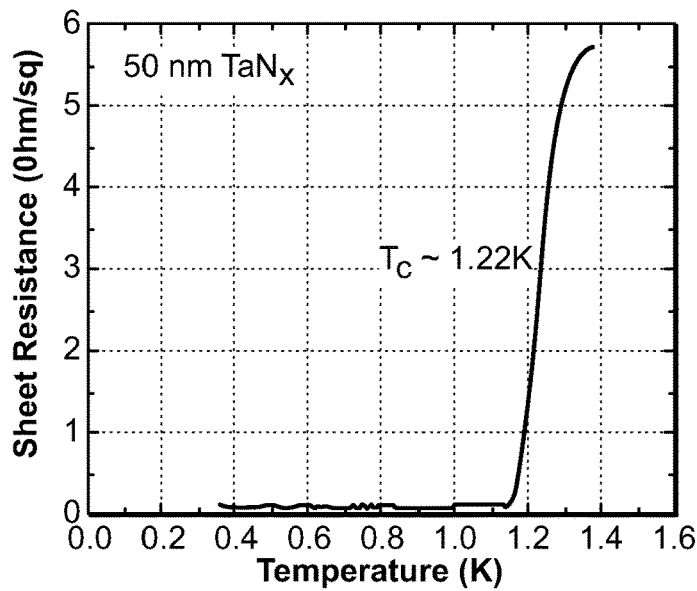
FIG. 2 shows that temperature dependence of resistance of TaN and transition to superconducting.

FIG. 2 shows sheet resistance versus temperature for a 50 nm TaNx film. The 50 nm TaNx film exhibits superconductivity at temperatures below 1.22 K. Information on the superconducting properties of TaN and VN films can be found in V. M. Pan et al., SUPERCONDUCTING PROPERTIES OF TaN AND VN FILMS, IEEE Transactions on Magnetics, VOL. 25, NO. 2, March 1989, which is incorporated by reference here in in its entirety and for all purposes.

The present technology enables integrating semiconductors with superconductors. In order to further elucidate the present technology, a number of exemplary embodiments are presented herein below.

Embodiment 1

Figure 3A:
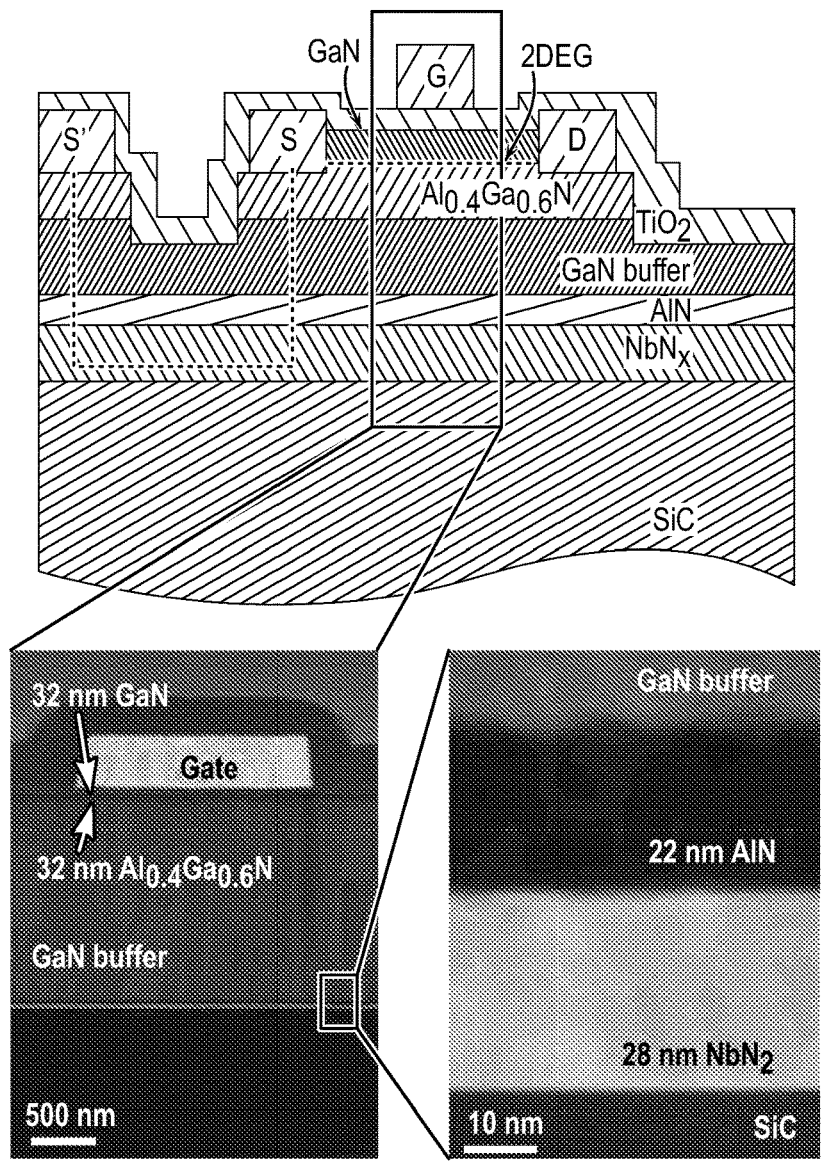
FIG. 3a shows cross-section schematic and STEM imaging of GaN/Al(Ga)N HEMTs/$NbN_x$ of this disclosure, grown by MBE on SiC substrates.

A GaN/AlGaN quantum-well heterostructure was grown on the buried epitaxial NbN$_x$ superconducting layer, as shown in FIG. 3a. Fabrication of the GaN HEMT structure shown in FIG. 3(a) started with the 356 MBE growth of 30 nm NbN$_x$ on 6H-SiC substrate, followed by 100 nm AlN nucleation, two-step 1.3 μm 357 GaN buffer layer, 30 nm Al$_{0.4}$Ga$_{0.6}$N and 30 nm GaN channel grown at 700° C. After the growth, ohmic contacts with Ti/Al/Ni/Au (20/100/10/50 nm) stacks were defined by optical lithography and e-beam evaporation. Rapid thermal annealing at 850° C. produced Ohmic contacts with contact resistance of 0.4 Ω-mm. Then inductively-coupled-plasma etching with a Cl$_2$/BCl$_3$/Ar gas was used to isolate separate HEMTs.

To reduce the gate leakage current, a 10 nm thick high-K dielectric layer of TiO$_2$ was deposited by atomic-layer-deposition at 300° C., followed by Pt/Au (30/200 nm) e-beam evaporation for gate metal stack. Finally, the TiO$_2$ on top of the drain and source contacts were removed with fluorine-based plasma etching, and a second metalization of Ti/Pt/Au (25/25/400 nm) is performed. Using fabricated van der Pauw structures, Hall-effect measurements were performed on the 2DEG at the GaN/Al$_{0.4}$Ga$_{0.6}$N interface and determined its electron concentration to be 1.3×10$^{13}$ cm$^{-2}$ with a mobility of 1350 cm$^2$/Vs at room temperature and 3400 cm$^2$/Vs at 2K, indicating that a high quality 2DEG channel is achieved in these heterostructures and more importantly, experienced no performance degradation as a result of processing.

After epitaxial growth of 28-nm NbN$_x$, on SiC, a 22-nm AlN layer, a 1.3 micron thick GaN buffer layer, a 32-nm Al0.4Ga0.6N barrier, and a 32-nm GaN channel layer are grown successively by MBE in a single run without breaking vacuum. The entire AlN/GaN/AlGaN/GaN heterostructure takes a nitrogen-polar wurtzite form of high crystallinity and has a sharp heterojunction. This is confirmed by Hall-effect measurements of mobility μ~1350 cm$^2$/V·s at 300 K and μ~3400 cm$^2$/V·s at 2K, with density n2d~1.3×10$^{13}$/cm$^2$ at 300 K and n2d~1.2×10$^{13}$/cm$^2$ at 2 K. The 2DEG is formed in a triangular quantum well that is produced at the top GaN/Al$_{0.4}$Ga$_{0.6}$N heterojunction owing to the Berry-phase-driven spontaneous and piezoelectric polarization difference between AlGaN and GaN. The high 2DEG mobility is comparable to that obtained in similar heterostructures without the NbN$_x$ buried layer, indicating a successful epitaxial integration. The Hall-effect measurement also proves that the 2DEG is electrically isolated from the buried NbN$_x$ metal layer. This 2DEG channel has enabled the integration of an HEMT with NbN$_x$. The quantum-transport properties of the 2DEG channel were probed by low-temperature magnetoresistance. Further information on these measurements is provided in U.S. Provisional Patent Application No. 62/639, 302, filed Mar. 6, 2018, which is incorporated herein by reference in its entirety and for all purposes. The presence of magnetic quantum oscillations demonstrates the high-quality epitaxial growth of the GaN/AlGaN 2DEG on the superconducting NbN$_x$ film.

Figure 3B:
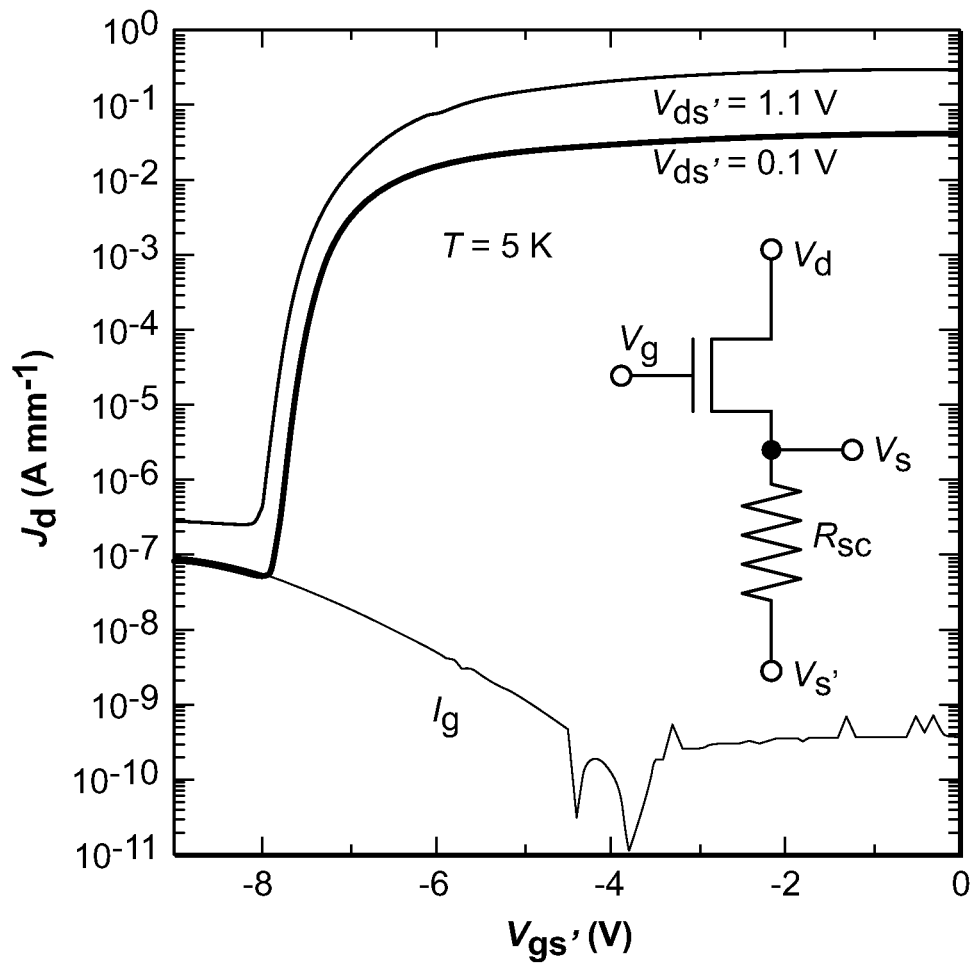
FIG. 3b shows Jd–Vgs' transfer curves of the HEMTs of this disclosure at 5 K showing a high on/off ratio at Vgs'=0.1&1.1 V.

FIG. 3b shows the HEMT drain current (Jd) per unit width, J$_d$=I$_d$/W, in logarithmic scale as a function of the gate voltage for two drain voltages at 5 K. Note that the gate voltage V$_{gs}$' (the voltage difference between gate g and source s') and drain voltage V$_{ds'}$ (the voltage difference between drain d and source s') are measured with the buried NbN$_x$ layer serving as the source load of the HEMT. The gate leakage current is low, and the drain current changes by about six to seven orders of magnitude as the Fermi level of the GaN quantum-well channel is pulled from inside the conduction band at Vgs'=0 V into the gap at Vgs'=−8 V. The high on/off ratio was also observed at room temperature, Embodiment 2

Figure 4:
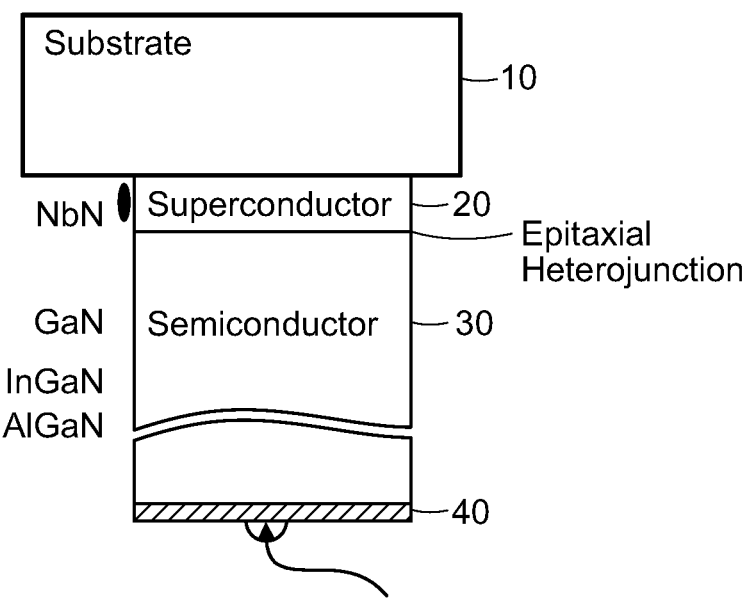
FIG. 4 shows another embodiment of the device of this disclosure.

FIG. 4 shows a representation of the second embodiment. FIG. 4 shows a layer of a superconductor material 20 epitaxially grown on a crystalline high thermal conductivity substrate 10. One or more layers of a semiconducting material 30 are epitaxially grown on the layer of superconductor material. The device shown in FIG. 4 also includes a metal contact 40 disposed on a surface of a last layer of semiconducting material 30. The epitaxial superconductor/semiconductor junctions, such as shown in FIG. 4, can allow for ultrafast Schottky diodes due to zero resistance of the superconductor, and tunnel junctions based on this structure can enable Cooper pair injection into the semiconductor. These epitaxial superconductor/semiconductor devices can also be used as very sensitive bolometers.

Superconductor-semiconductor (ultrafast Schottky) diodes can be used as microwave mixers, in RF superconducting quantum interference device (rf SQUID) readout electronics, as a video detector of high-frequency radiation. The layer of a superconductor material 20 can include nano slits (which can be used to allow observation of recombination radiation).

Figure 5:
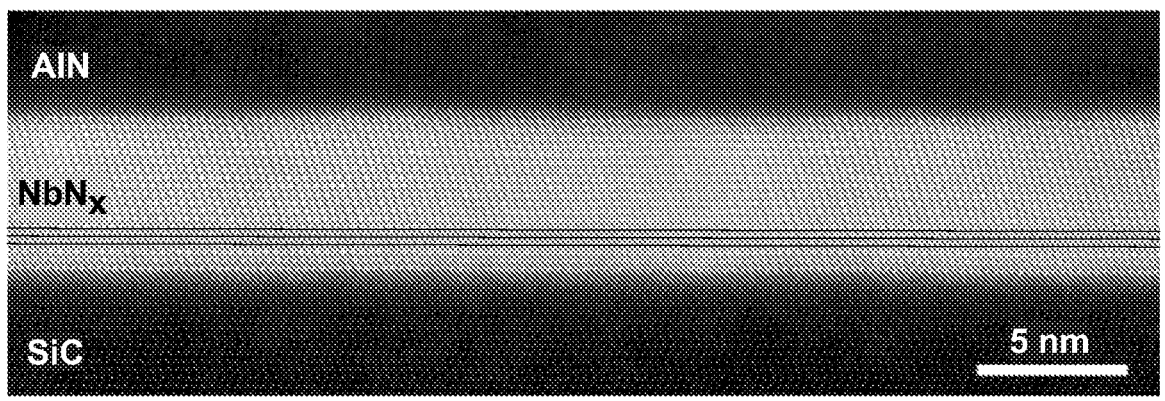
FIG. 5 shows a large area STEM of MBE AlN/$NbN_X$/SiC heterostructure of this disclosure.

FIG. 5 shows a large area scanning transmission electron microscope (STEM) of MBE AlN/NbN$_X$/SiC heterostructure. FIG. 5 shows a STEM image of NbN$_X$/AlN grown on top of SiC substrate, showing the single crystal nature of NbN$_X$ over a large region. Lines have been added as a guide to show the crystallinity across the entire range measured.

Embodiment 3

Figure 6A:
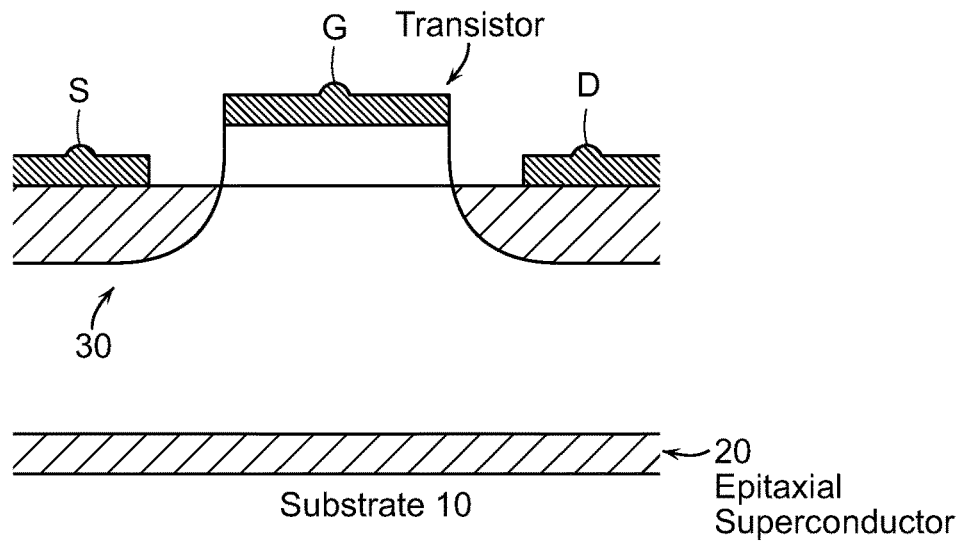
FIG. 6a shows a schematic representation of the transistor of this disclosure.
Figure 6B:
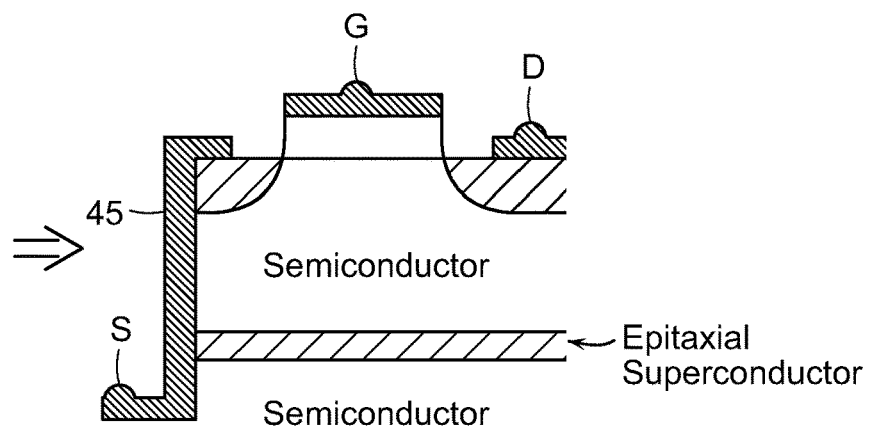
FIG. 6b shows a metal layer through a via connecting the layer of superconductor material to one of the metal contacts of the transistor of this disclosure.
Figure 6C:
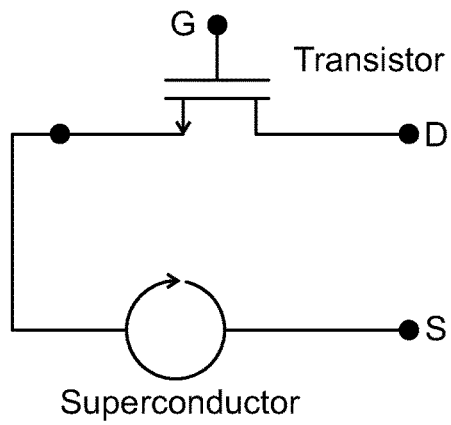
FIG. 6c depicts a schematic circuit diagram of a configuration in FIG. 6b.

The superconducting layer 20 can be used as a lossless interconnect. FIG. 6a shows a schematic representation of the transistor shown in FIG. 3a, including metal contacts for each of the source (S), drain (D) and gate (G). FIG. 6b shows a metal layer 45 through a via connecting the layer of superconductor material 20 to one of the metal contacts, the metal contact for the source. FIG. 6c shows a circuit diagram depicting the source being connected through the superconductor material.

Figure 7A:
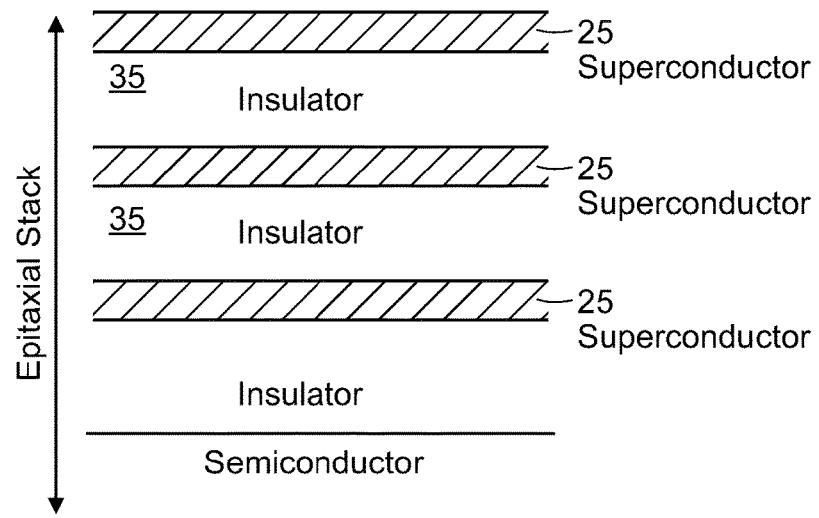
FIG. 7a shows yet another embodiment of the device of this disclosure.
Figure 7B:
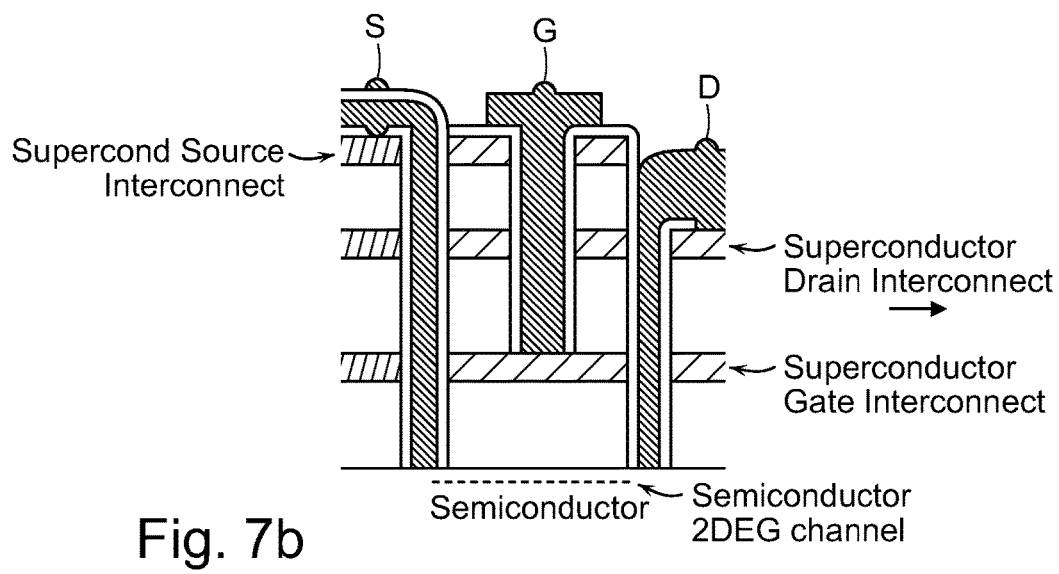
FIG. 7b shows a first metal layer, through a first via, connects the first metal contact for the drain to one of a first layer of the two layers of the superconductor material and a second metal layer, through a second via, connects the metal contact for the source to another one of the two layers of the superconductor material.
Figures 7C, 7D:
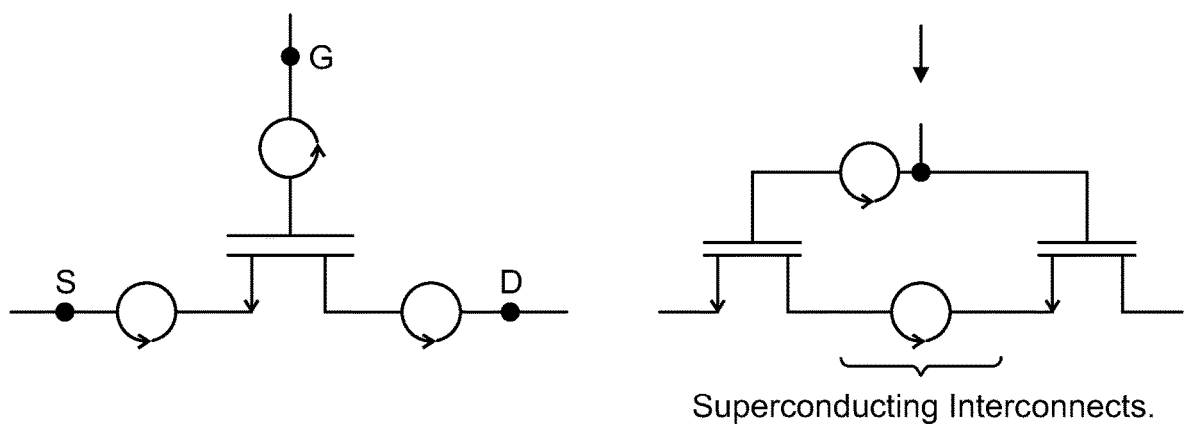
FIG. 7c shows a circuit schematic for an embodiment in which the source, drain and gate are connected to layers of semiconductor material.
FIG. 7d shows a circuit schematic for an embodiment in which two transistors are connected by superconducting interconnects of this disclosure.

In one instance, superconducting layers under circuits, or multilayer structures realized on top of the semiconductor transistor can be used as a lossless interconnect in digital and in microwave circuits. In one embodiment, one or more structures are epitaxially grown on the superconductor material 20, where the one or more structures include an insulator layer and another layer of the superconductor material epitaxially grown on the insulator layer; and the one or more layers of a semiconducting or insulating material are epitaxially grown on a last layer of the superconductor material from the one or more structures. FIG. 7a shows two structures epitaxially grown on the layer of superconductor material 20. FIG. 7b shows a first metal layer 42, through a first via, connects the metal contact for the drain to one of a first layer of the two layers of the superconductor material. A second metal layer 47, through a second via, connects the metal contact for the source to another one of the two layers of the superconductor material. FIG. 7c shows a circuit diagram showing the source, gain and drain being connected through layers of superconductor material. FIG. 7d shows two transistors being connected using superconducting interconnects as in the present disclosure. The superconducting interconnects can significantly reduce the energy lost in I$^2$R heating in transistor circuits. The superconducting interconnects and microwave lines can enable high-quality factor resonators and precision delay lines and clocks in coordination with semiconductor amplifiers.

Embodiment 4

Figure 8A:
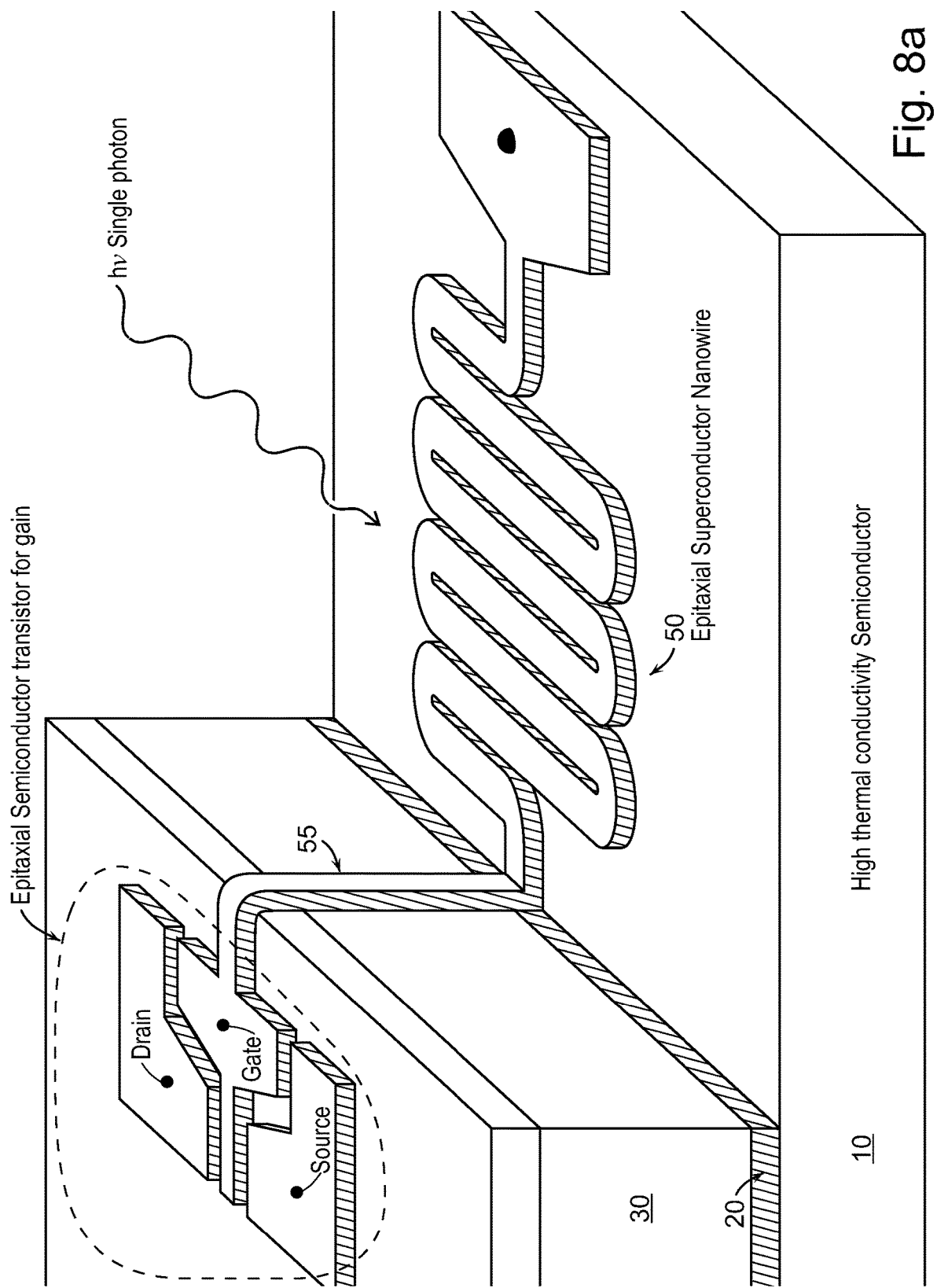
FIG. 8a shows a transistor (HEMTs) of this disclosure etched down, at one surface, to a portion of the crystalline high thermal conductivity substrate, and another layer of the superconductor material epitaxially grown on that portion of the crystalline high thermal conductivity substrate in a nanowire serpentine pattern and operatively electrically connected to one of the gate or the source of the transistor.

The inductively-coupled-plasma etching was used to isolate separate transistors (HEMTs) in FIG. 3a can be used to etch down, at one surface, to a portion of the crystalline high thermal conductivity substrate, as shown in FIG. 8a. Another layer of the superconductor material 50 is epitaxially grown on that portion of the crystalline high thermal conductivity substrate 10 in a nanowire serpentine pattern and operatively electrically connected 55 to one of the gate or the source of the transistor. In one instance, the other layer 50 is also epitaxially grown on the one surface and makes an electrical connection to one of the gate or the source of transistor.

Figure 8B:
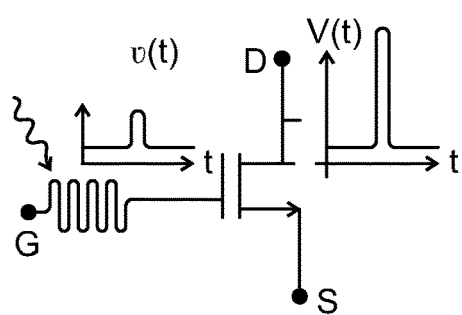
Figure 8C:
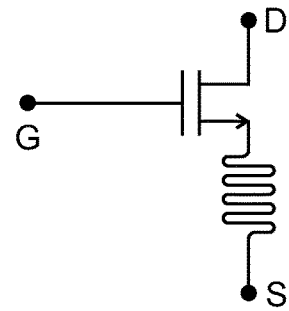
FIG. 8c shows a schematic circuit diagram of an embodiment in which the nanowire patterned layer is operatively electrically connected to the source of the transistor.

The superconducting nano wire can be used as a superconducting single photon detector (SSPD). The high thermal conductivity of the substrate such as SiC will allow for ultrafast heat dissipation, and recovery time of the SSPD. The direct integration with the transistor amplifier enables direct integration of the singe photon detector by achieving fan out, offering the capability to drive several other circuit elements for high speed single-photon imaging. The direct integration also provides for a reduction in noise and unwanted signal. FIGS. 8b and 8c shows circuit diagrams of the transistor connected to the superconducting nanowire.

Embodiment 5

Figure 9A:
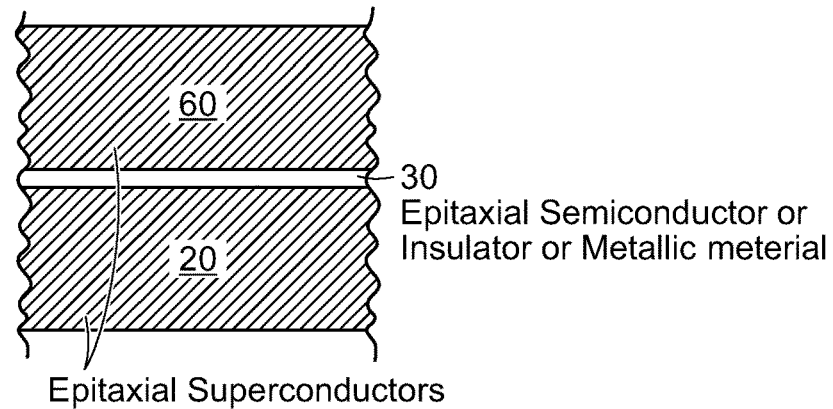
FIG. 9a shows an embodiment of the device of this disclosure resulting in a Josephson junction.
Figure 9B:
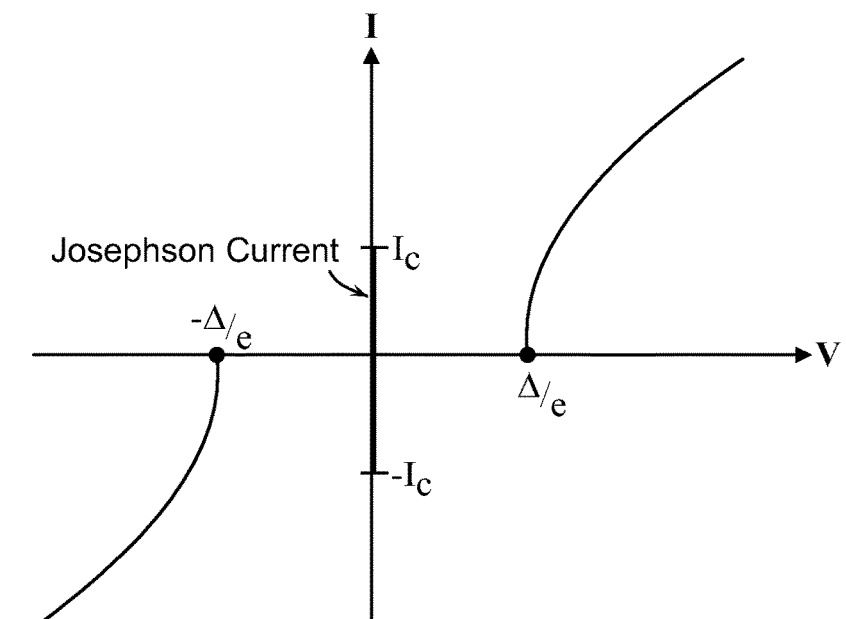
FIG. 9b shows the IV characteristics depicting characteristic parameters of the Josephson junction.

When the one or more layers of semiconductor or insulator or metallic material 30 in FIG. 1 is one layer, epitaxially growing another layer of superconductor material 60 result in a Josephson junction configuration, as shown in FIG. 9a. FIG. 9b shows the IV for a Josephson junction. Due to the epitaxial nature of the superconductor/semiconductor junctions, the insulator will have fewer different states. The epitaxial fabrication method of the present disclosure enables wafer level control of the Josephson current by epitaxially ensure uniformity, high-yield and also make the process scalable. The epitaxial interfaces and epitaxial insulator enables high quantum coherence times.

Figure 9C:
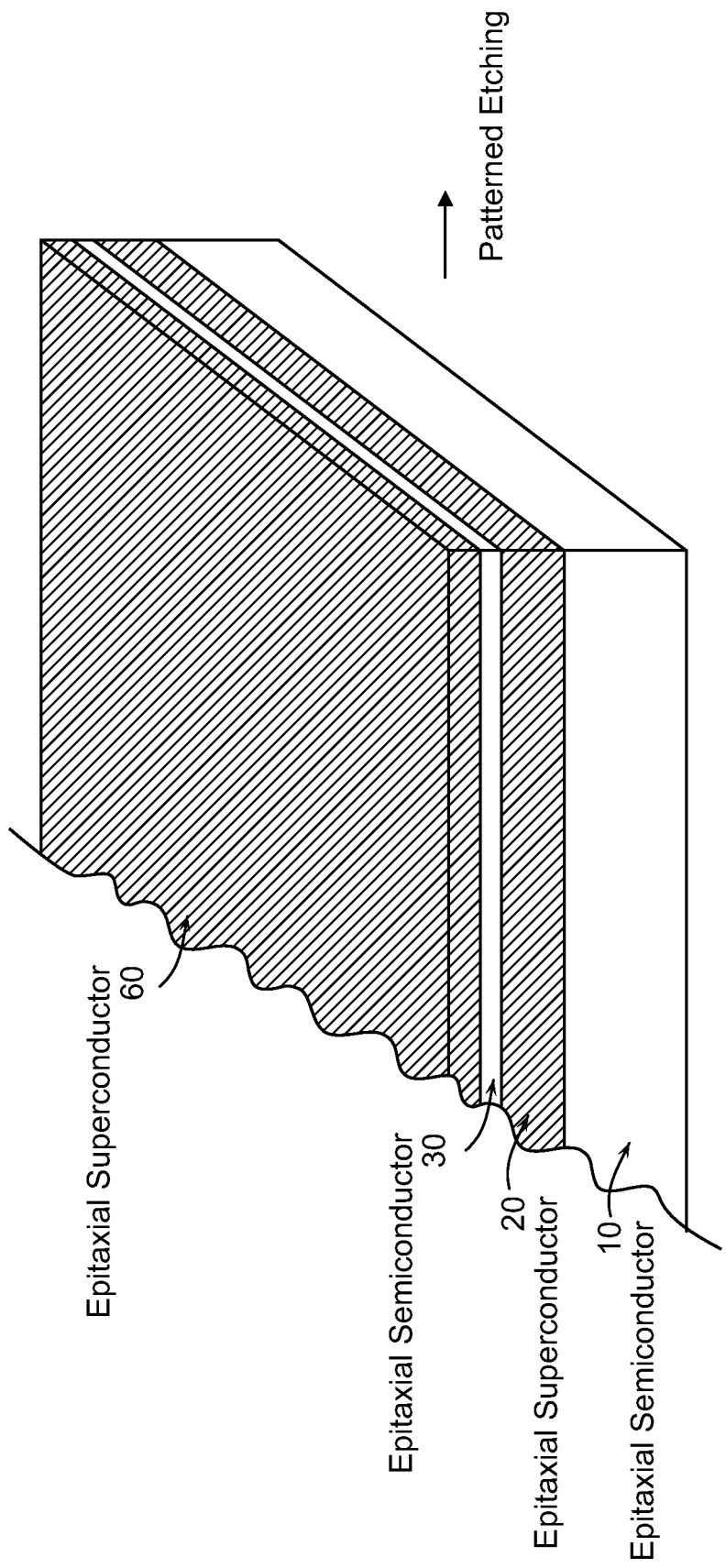
Figure 9D:
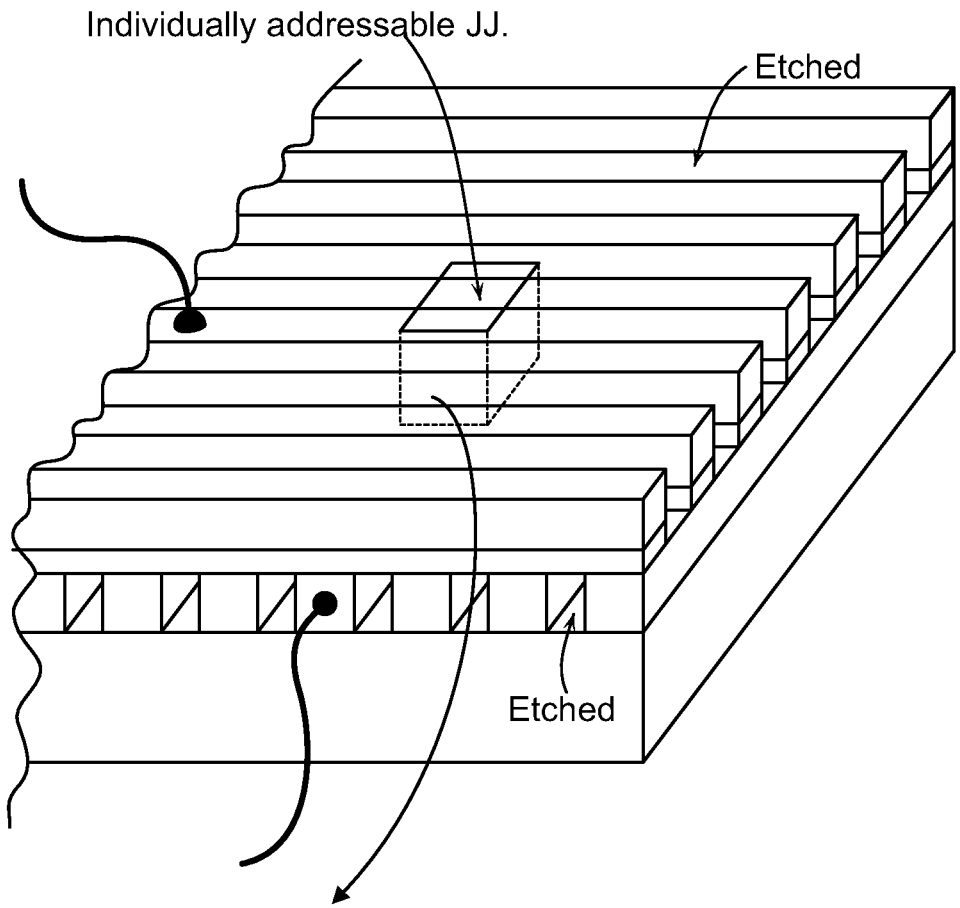
FIG. 9d shows patterned etching of the structure as shown in FIG. 9c, resulting in a Josephson junction crossbar array.
Figure 9E:
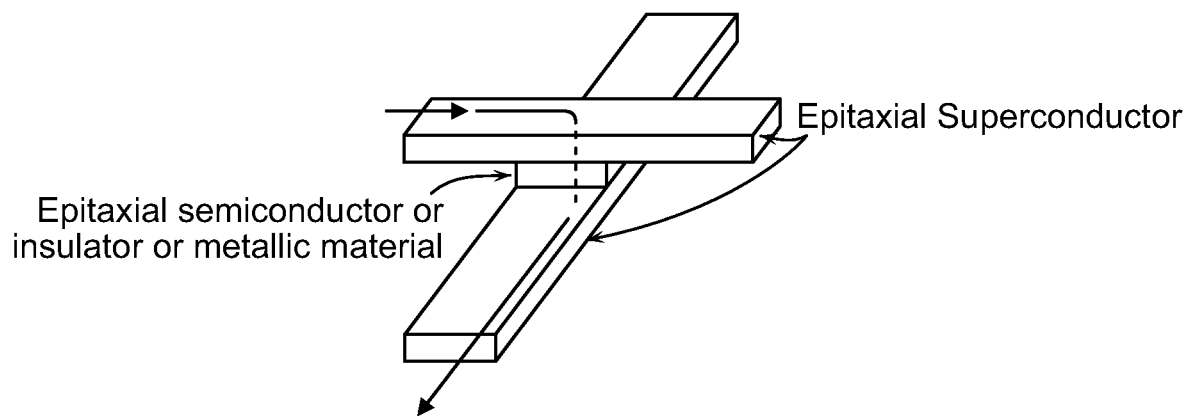
FIG. 9e shows an element of the Josephson junction crossbar array of this disclosure.

FIG. 9c is a perspective view of FIG. 9a. Patterned etching of the structure, as shown in FIG. 9d, resulting in a Josephson junction crossbar array, an element of which is shown in FIG. 9e.

The method of the present disclosure for forming a crossbar array of Josephson junctions starts by epitaxially growing a first layer of superconductor material on a crystalline high thermal conductivity substrate, where the superconductor material is one of TiNx, ZrNx, HfNx, VNx, NbNx, TaNx, MoNx, TaNx, or alloys thereof, and the crystalline high thermal conductivity substrate is one of GaN, AlN, 4H- and 6H-SiC, AlScN, GaScN, 3C-SiC or Si. A layer of semiconducting or insulating or metallic material is then epitaxially grown on the layer of superconductor material, as described hereinabove. A second layer of the superconductor material is epitaxially grown on the layer of semiconducting or insulating material and is etched so that a pattern of linear elements extending along one of two orthogonal axes in a plane is formed. The first layer of superconductor material is then etched such that a pattern of linear elements extending along another one of the two orthogonal axes in the plane is formed.

In one instance, etching the second layer of the superconductor material and etching the first layer of the superconductor material includes etching the epitaxially grown layers so that a pattern of linear elements extending along one of two orthogonal axes in a plane is formed, subsequently etching the second layer of the superconductor material and the layer of the semiconducting or insulating or metallic material such that a pattern of junction elements disposed in a two dimensional array in the plane is formed, refilling with a non-electrically conducting material, planarizing to a surface of the second layer of the superconductor material opposite a surface on which the second layer of the superconductor material was epitaxially grown, and depositing a structure of interconnects electrically connecting elements of the two dimensional array extending along another of the two orthogonal axes, such that every element is individually accessible at an intersection of the two orthogonal axes in the plane. The non-electrically conducting material can be selected such that the interconnects can be epitaxially grown. In that instance, the structure of interconnects is a structure of superconductor material interconnects.

Figure 10A:
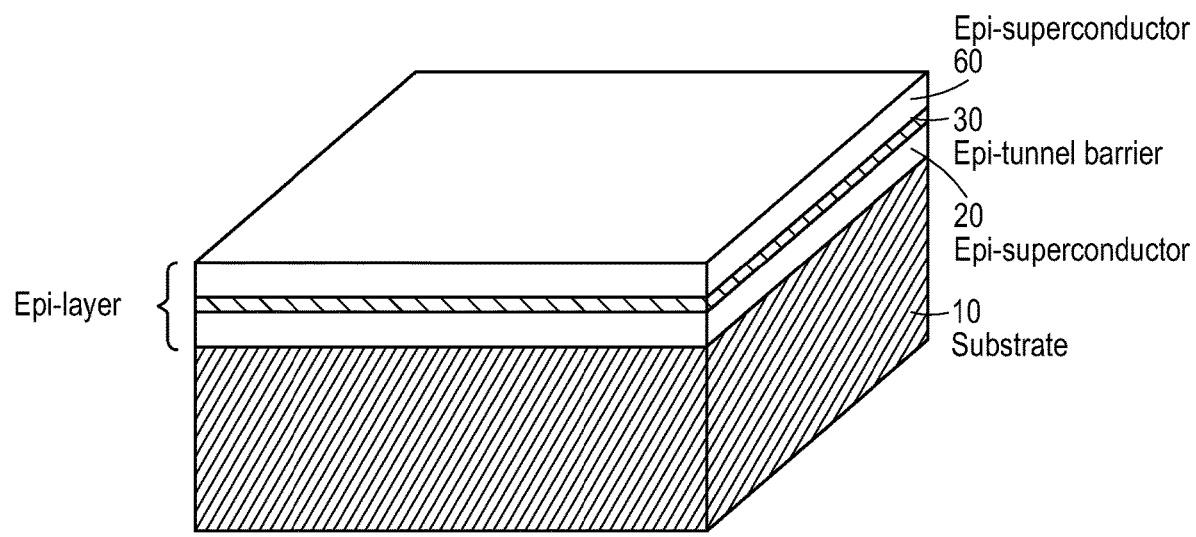
Figure 10B:
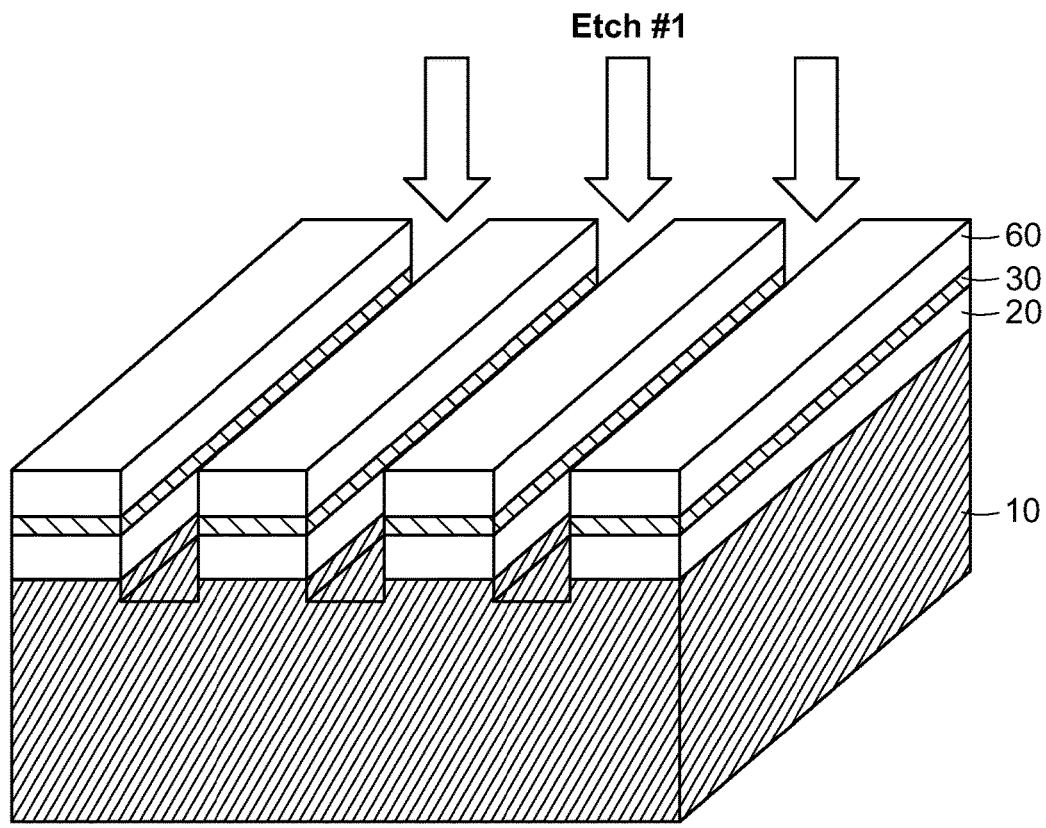
Figure 10C:
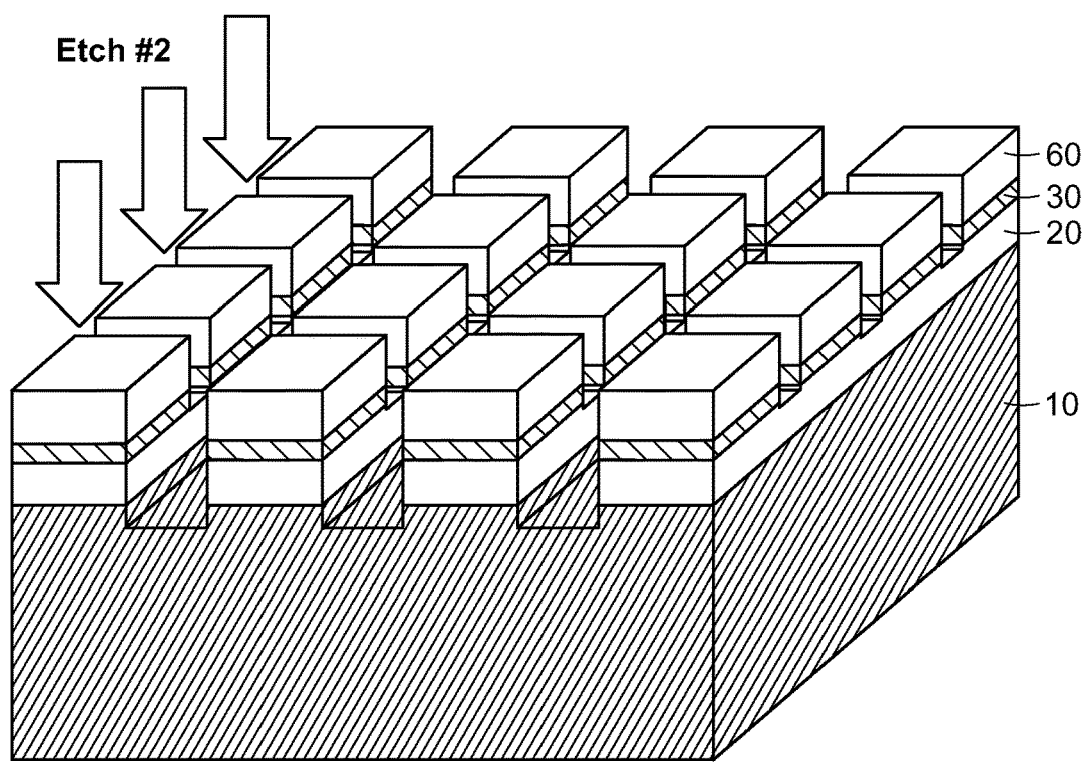
Figure 10D:
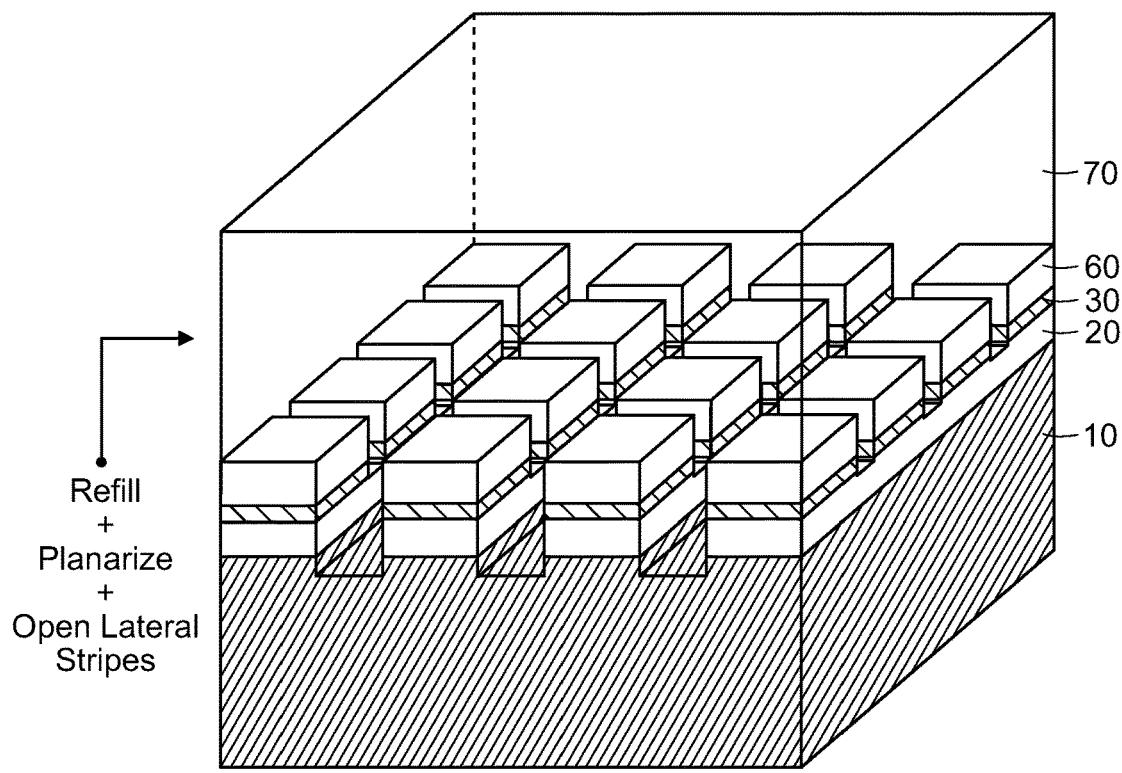

FIGS. 10a through 10e depict one embodiment of the method of the disclosure for forming a crossbar array of Josephson junctions. FIG. 10a shows the same configuration as FIG. 9c. FIG. 10b shows etching the epitaxially grown layers 20, 30, 60 and substrate 10 so that a pattern of linear elements extending along one of two orthogonal axes in a plane is formed. FIG. 10c shows subsequently etching the second layer 60 of the superconductor material and the layer 30 of the semiconducting or insulating material such that a pattern of junction elements disposed in a two-dimensional array in the plane is formed. FIG. 10d shows refilling with a non-electrically conducting material 70. The material 70 is planarized to a surface of the second layer of the superconductor material opposite a surface on which the second layer of the superconductor material was epitaxially grown. Then, lateral stripes are opened. FIG. 10e shows depositing a structure of interconnects 80 electrically connecting elements of the two-dimensional array extending along another of the two orthogonal axes, such that every element is individually accessible at an intersection of the two orthogonal axes in the plane, One skill in the art would understand that the present disclosure has a substantial number of other applications and that the embodiment presented hereinabove our exemplary embodiments. The present disclosure is not limited only to the exemplary embodiments.

While the subject technology has been described with respect to preferred embodiments, those skilled in the art will readily appreciate that various changes and/or modifications can be made to the subject technology without departing from the spirit or scope thereof. For example, each claim, in whole or in part, may depend from any or all claims in a multiple dependent manner even though such has not been originally claimed.

What is claimed is:

1. A solid-state device comprising:
   at least one layer of a superconductor material epitaxially grown on a crystalline high thermal conductivity substrate; the superconductor material being one of TiNx, ZrNx, HfNx, VNx, NbNx, TaNx, MoNx, WNx, or alloys thereof; and
   one or more layers of a semiconducting or insulating or metallic material epitaxially grown on one of the at least one layer of superconductor material; the semiconducting or insulating material being one of a Group III-N (nitride) material or alloys thereof or a Group 4b-N (nitride), or transition metal nitride material, or SiC or alloys thereof; wherein the one or more layers comprise at least two layers, one of said at least two layers being a semiconducting layer; wherein the at least two layers comprise a semiconductor heterostructure and a semiconductor quantum well heterostructure; and wherein the semiconductor heterostructure comprises a transistor.

2. The solid-state device of claim 1, wherein the crystalline high thermal conductivity substrate is one of GaN, AlN, 4H- and 6H-SiC, AlScN, GaScN, 3C-SiC or Si.

3. The solid-state device of claim 1, wherein the solid-state device also comprises a metal contact disposed on a surface of a last layer of semiconducting material, said surface being opposite a surface disposed on the layer of the superconductor material.

4. The solid-state device of claim 1, wherein the one or more layers that comprise a semiconductor heterostructure are epitaxially grown on an exposed one of the at least one layer of superconductor material.

5. The solid-state device of claim 1 further comprising metal contacts for each of source, drain and gate of the transistor, and a metal layer through a via connecting the layer of superconductor material to one of the metal contacts.

6. A solid-state device comprising:
   a layer of a superconductor material epitaxially grown on a crystalline high thermal conductivity substrate; the superconductor material being one of TiNx, ZrNx, HfNx, VNx, NbNx, TaNx, MoNx, WNx, or alloys thereof; and
   one or more layers of a semiconducting or insulating or metallic material epitaxially grown on the layer of superconductor material; the semiconducting or insulating material being one of a Group III-N (nitride) material or alloys thereof or a Group 4b-N (nitride), or transition metal nitride material, or SiC or alloys thereof; wherein the one or more layers comprise at least two layers, one of said at least two layers being a semiconducting layer; wherein the at least two layers comprise a semiconductor heterostructure; wherein at least a portion of the semiconductor heterostructure forms a transistor; wherein the transistor is, at one surface, etched down to a portion of the crystalline high thermal conductivity substrate; wherein the solid-state device further comprises another layer of the superconductor material, said another layer being epitaxially grown on said portion of the crystalline high thermal conductivity substrate in a nanowire meander pattern and operatively electrically connected to one of a gate or a source of the transistor.

7. The solid-state device of claim 6, wherein said another layer is epitaxially grown on said one surface and makes an electrical connection to one of the gate or the source of transistor.

8. The solid-state device of claim 1, wherein the one or more layers also comprise a first layer of the semiconducting or insulating or metallic material; and wherein the solid-state device further comprises another layer of the superconductor material epitaxially grown on the one layer of the semiconducting or insulating material.

9. The solid-state device of claim 8 wherein said another layer of the superconductor material is etched in order to form a pattern of linear elements extending along one of two orthogonal axes in a plane; and wherein said layer of the superconductor material is etched in order to form a pattern of linear elements extending along another one of the two orthogonal axes in the plane.

10. The solid-state device of claim 1, wherein the semiconductor heterostructure is a Group III-N semiconductor heterostructure; and wherein the one or more layers are N-polar layers.

11. The solid-state device of claim 1, wherein the one or more layers are N-polar layers.

12. The solid state device of claim 1, wherein said at least one layer comprises one or more structures epitaxially grown on a first layer of the at least one layer of the superconductor material, the one or more structures comprising an insulator layer and another layer of the superconductor material epitaxially grown on the insulator layer; and wherein the one or more structures are epitaxially grown on the layer of superconductor material; and wherein said one or more layers are epitaxially grown on a last layer of the superconductor material from the one or more structures.

13. The solid-state device of claim 12, wherein the semiconducting or insulating material is one of a Group III-N (nitride) material or alloys thereof or a Group 4b-N (nitride), or transition metal nitride material; and wherein the one or more layers are N-polar layers.

14. The solid-state device of claim 13, wherein the one or more structures comprise two structures.

15. The solid-state device of claim 6, wherein the semiconducting or insulating material is one of a Group III-N (nitride) material or alloys thereof or a Group 4b-N (nitride), or transition metal nitride material; and wherein the one or more layers are N-polar layers.

\* \* \* \* \*